June 30, 1953 J. AVINS 2,644,082

AUTOMATIC GAIN CONTROL SYSTEM

Filed Feb. 23, 1949

INVENTOR
JACK AVINS
BY H. L. Newton
ATTORNEY

Patented June 30, 1953 2,644,082

UNITED STATES PATENT OFFICE 2,644,082

AUTOMATIC GAIN CONTROL SYSTEM

Jack Avins, New York, N. Y., assignor to Radio Corporation of America, a corporation of Delaware Application February 23, 1949, Serial No. 77,774

3 Claims. (Cl. 250—20)

This invention relates to automatic gain control systems and more particularly to automatic gain or "volume" control systems for use with tunable signal amplifiers such as radio receivers.

Conventional automatic gain control (AGC) systems function by lowering the gain of one or more amplification stages with increases in strength of a desired signal passing through these stages. This provides the desirable feature of more or less equalizing volume control settings regardless of wide intensity variations in the signals being tuned in. However the tuning itself is adversely affected by such systems. As the stages are tuned to receive and pass signals in a specific frequency channel, increases in signal response upon approach to exact tuning are offset by automatically produced decreases in gain. It is accordingly difficult to determine the point of exact tuning to the desired signals. Furthermore when used with radio receiver systems such as those receiving and demodulating frequency modulated (FM) carrier waves, undesired responses of relatively high intensity may be produced when the receiver is slightly detuned. This is caused by the demodulating action of resonant tuning circuits present in the receiver on frequency modulated waves. When a resonant circuit is so tuned that frequency modulated waves fall along a sloping side of the generally bell-shaped resonance characteristic, the resonant circuit will show a response that varies in amplitude in accordance with frequency variations in the waves. These side responses correspond to the amplitude variations produced by the desired demodulating action, and will find their way into the demodulated output circuit of the receiver. Side responses of this nature are not desirable. In addition to the confusion they introduce into the tuning, they are of generally poor fidelity. With the conventional type of automatic gain control system as described above, the undesirable side responses sometimes become of even greater magnitude than the exactly tuned desired responses, thereby giving misleading tuning indications when the demodulated output intensity is relied on as a guide to proper tuning.

Among the objects of the present invention are the provision of novel circuits and methods for automatically controlling the gain of tunable signal amplifiers without the above difficulties.

Further objects of the invention include the provision of novel automatic gain control systems for improving the operation of tunable signal receivers by supplying a composite gain control voltage.

Other objects of the invention are the provision of novel automatic gain control systems which supply a gain control voltage as a composite of two individual voltages, one of which individual voltages may be independently used for actuating auxiliary tuning indicators.

The foregoing, as well as additional objects of the invention will be more readily understood from the following description of exemplifications thereof, reference being made to the accompanying drawings wherein:

Figure 1 is a block diagram of the essential elements of an automatic gain control system embodying the invention;

Figures 1*a*, 1*b*, and 1*c* are curve diagrams illustrating the operation of the invention;

According to the present invention, automatic gain control is effected by means of a composite automatic gain control voltage formed by combining two different signal-responsive voltages. The composite control voltage is given a frequency responsive characteristic that improves the reception of signals in desired frequency channels. In addition one of the different signal-responsive voltages may be used by itself to operate auxiliary tuning indicators such as those of the conventional visual type.

Figure 1:
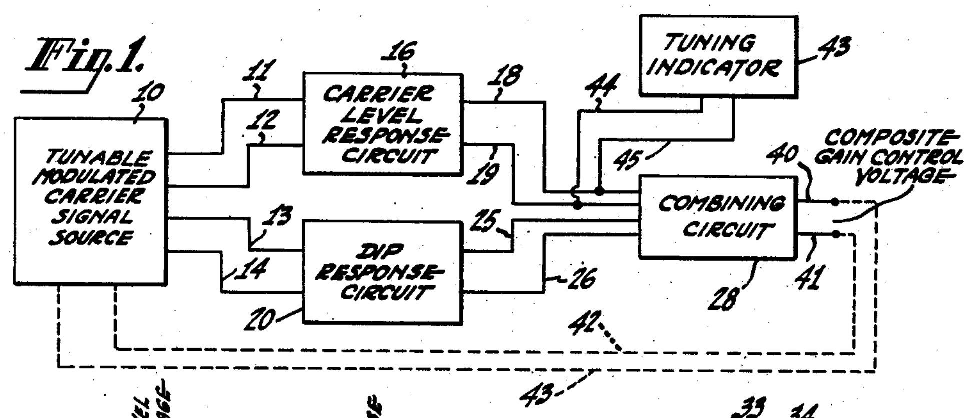

Figure 1 shows the automatic gain control system of the invention in a form which brings out its underlying principles. A modulated carrier signal source 10 supplies signals indicative of the degree of gain that is desired, and may be, for example, a portion of a radio receiver. The supplied signals are passed through one set of output leads 11, 12 to a carrier level response circuit 16 and through another set of output leads 13, 14 to a dip response circuit 20. The carrier level response circuit 16 develops at output leads 18, 19 a first voltage corresponding to the response of this circuit to the carrier level of the signals supplied by source 10. Any suitable combination for indicating the relative carrier level may be used in this circuit. One convenient arrangement is provided by including one or more resonant circuits tuned to a frequency corresponding to the carrier frequency. As the supplied signals are tuned in, the carrier level response increases reaching a maximum at exact tuning and falling away on either side.

Figures 1A, 1B, 1C:
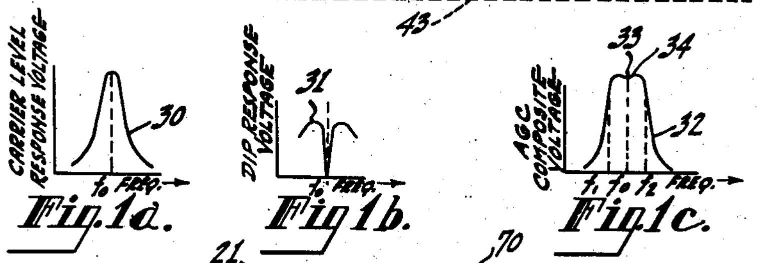

Figure 1*a* illustrates the carrier level response in the form of curve 30 showing the relation of tuning frequency on one axis and carrier response level voltage on the other. At $f_0$ the exact point of tuning is represented, the curve 30 being there at a maximum. As the signals are detuned in either direction, the response falls off rapidly, as shown.

The dip response circuit 20 is supplied with the same gain indicating signals delivered by source 10 but not necessarily at the same intensity or level of amplification. Output leads 25, 26 for dip response circuit 20 are arranged to carry a voltage having a minimum at the point of exact tuning and rising in either direction. Figure 1*b* shows by curve 31 a suitable form of voltage response for circuit 20. The horizontal or tuning frequency axis of curve 31 is identical with that shown for curve 30 in Figure 1*a*. As indicated, at the exact tuning point $f_0$ the voltage output is very low, rising rapidly on either side.

The separate voltages developed by circuits 16 and 20 respectively are combined in combining circuit 28 having output leads 40, 41 between which a resultant composite gain control voltage appears. The combining circuit merely adds the magnitudes of the individual voltages either in whole or in part.

Figure 1*c* shows at curve 32 a typical composite voltage produced by addition of voltages 30 and 31. At the center frequency $f_0$ very little is added to the height of curve 30 as indicated at 33. On both sides of the center frequency more and more amplitude is added to curve 30, giving rise to a generally flat distribution indicated at 34. Upon reaching the frequency limits of the desired signals represented at $f_1$ and $f_2$, the response of curve 32 falls away rapidly.

The composite automatic gain control voltage is connected to amplifiers associated with the signal source 10 as shown by dash lines 42, 43, to control the amplifier gain, increasing the gain for low automatic gain control voltages and decreasing the gain for high automatic gain control voltages. The variation in gain may be provided by using conventional biased amplifiers which vary their gain in response to changes in bias, the composite automatic gain control voltage of the invention supplying the gain-controlling bias.

A feature of the invention is the fact that the automatic gain control voltage remains approximately constant or increases slightly as the tuning system shifts from exact tuning $f_0$ to the tuning limits $f_1$ and $f_2$. Accordingly, the normally expected dropping off of signal intensity, as a result of mistuning the system is caused to make itself evident, and may even be intensified. As a result there is a considerable decrease in the response of the system with departure from exact tuning, thereby effectively diminishing any undesired side responses such as the mistuned frequency modulation responses. Furthermore, the maintenance of relatively high automatic gain control voltage beyond the normal limits of signal tuning cuts down on the amount of extraneous noise ordinarily introduced by reason of the large increase in amplifier gain that would otherwise take place as the conventional system tries to receive a detuned signal.

A further feature of the invention is the use of one of the individual voltages from circuit 16 or 20 to operate an auxiliary tuning indicator 43. In the form shown in Figure 1 the tuning indicator 43 has supply leads 44, 45 connected to carrier level response voltage leads 18 and 19. The tuning indicator may alternatively be operated by the dip response voltage appearing between leads 25 and 26. By reference to Figures 1*a*, 1*b* and 1*c* it will be noted that the composite automatic gain control voltage 32 has a relatively broad maximum 34 so that an accurate indication of tuning is not available from this voltage. However the carrier level response 30 or the dip response voltage 31 are of much sharper nature and are highly suited for indicating exact tuning. Any convenient auxiliary tuning indicator may be used such as the electron ray type of indicator described on pages 30 and 31 of the RCA Receiving Tube Manual, Technical Series RC–14, Copyright 1940 by RCA Manufacturing Co., Inc.

Figure 2:
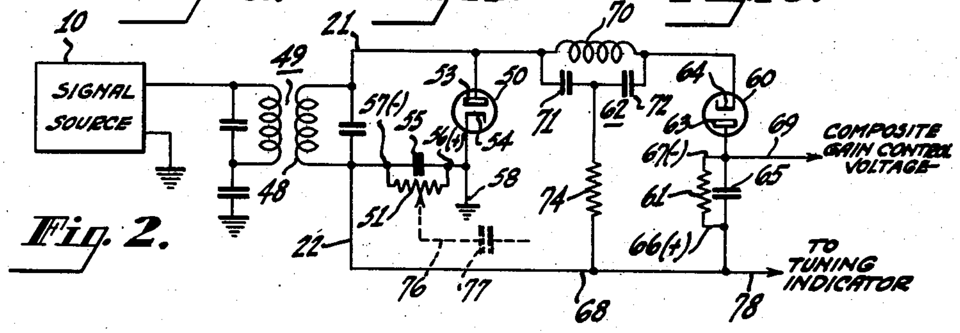
Figure 2 is a circuit diagram of one specific form of automatic gain control system of the invention.

Figure 2 shows one example of a composite automatic gain control circuit exemplifying the invention. Here, a single pair of supply leads 21, 22 delivers signals to a carrier level response circuit including rectifier 50 and rectifier load impedance 51, as well as to a dip response circuit including filter 62, rectifier 60, and rectifier load impedance 61. The supply leads 21, 22 may be connected to the secondary windings 48 of a conventional coupling transformer 49, coupling the leads with signal source 10.

Rectifiers 50 and 60 have anode electrodes 53 and 63, and cathode electrodes 54 and 64 respectively. Between the electrodes each rectifier presents a low resistance to voltages of one polarity and a higher resistance to voltages of opposite polarity. Of the alternating current (A. C.) signal voltages developed between lead 21 and lead 22, rectifier 50 effectively transmits only those portions during which lead 21 is more positive than lead 22. Direct current (D. C.) will accordingly flow in the D.-C. path established by the rectifier 50, rectifier load 51, lead 22, windings 48, and lead 21. To more effectively complete the A.-C. signal path through rectifier 50, an A.-C. by-pass capacitor 55 is connected across the load impedance 51. As a result of the passage of rectified direct current through the load impedance 51, one terminal 56, which is connected to the rectifier cathode 54 will become positive with respect to the other terminal 57, which is connected to the rectifier anode. The positive terminal 56 is grounded as shown at 58.

Filter 62 which includes a resonant circuit formed by inductance 70 and capacitances 71, 72, supplies signals from lead 21, 22 to a dip response rectifier 60, but selectively diminishes the transfer at frequencies corresponding to the signal carrier or exact frequency tuning $f_0$. Inductance 70 and capacitances 71, 72 form a parallel resonant circuit tuned to this frequency and present a high resonant impedance to the transfer of corresponding signals. For improving the rejection of resonant frequencies a resistance 74 is connected between conductor 22 and the junction of capacitances 71, 72. This is in accord with the well-known resistance cancellation principles as described for example in the article by Landon in the RCA Review, vol. 1, October, 1936, pages 93 to 101.

Dip response rectifier 60 has its cathode 64 connected to the same lead as anode 53 of rectifier 50, and has its anode 63 connected to the lead supplying cathode 54 of rectifier 50. Accordingly rectifier 60 will effectively pass current only when lead 21 is negative with respect to lead 22. Rectifier load 61 accordingly has its anode terminal 67 becoming negative with respect to the cathode terminal 66 as indicated. An A.-C. signal by-pass capacitor 65 completes the dip response circuit.

Lead section 68 of lead 22 extends from negative terminal 57 of load 51 to the positive terminal 66 of load 61 and functions to combine the carrier level voltage with the dip response voltage so that a negative composite gain control voltage is provided between terminals 67 and ground return 58. This negative voltage may be directly applied to biased amplifiers such as those of the electron discharge tube type, by suitably connecting lead 69.

Additional lead 78 connected to lead 22 supplies, with respect to ground, the negative carrier response voltage of terminal 57. This voltage is shown as actuating a tuning indicator.

The circuit arrangement of Figure 2 is highly suited for radio receivers which receive and demodulate frequency modulated radio signals as explained above. However, the arrangement is also suitable for improving the reception of amplitude modulation (AM) signal receivers. When used with amplitude modulation signals, by-pass capacitor 55 may be arranged to merely by-pass the high frequency carrier waves and present a relatively high impedance to modulating frequencies. Load 51 will then develop not only the D.-C. carrier level response voltage but in addition this voltage will be combined with alternating signals corresponding to the amplitude modulation of the carrier. A demodulated signal take-off connection in a form of a tap 76 and blocking capacitor 77 may accordingly be connected to load 51 to deliver the demodulated signals to a suitable utilization means such as additional amplifiers and/or a reproducer such as a loudspeaker (not shown). The tap 76 may be made adjustable as indicated for providing volume control changes as desired.

To prevent demodulated signal variations from interfering with the composite gain control voltage, additional capacitance may be connected between lead 69 and ground return 58 if the amplifier bias circuit to which lead 69 is connected does not include a sufficient ground return bypass capacitance. The effect of this ground return capacitance may be to reduce the A.-C. signal intensity at load 51 unless sufficient isolation is provided between this capacitance and terminal 57. For this purpose, resistance may be inserted in lead 69 or lead section 68.

Figures 3, 4:
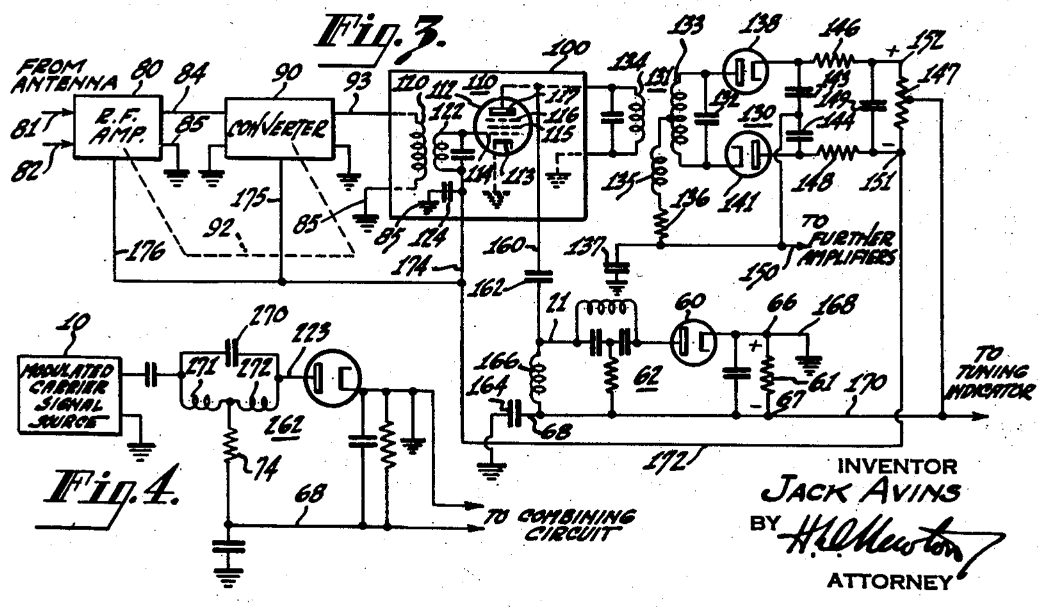
Figure 3 is a circuit diagram of a portion of a frequency modulated signal receiver incorporating a modified form of automatic gain control system according to the invention, parts being shown in block diagram form.
Figure 4 is a circuit diagram of a portion of an alternative automatic gain control system exemplifying the invention.

Figure 3 shows in greater detail a section of a frequency modulation radio signal receiver incorporated in the invention. Radio frequency (RF) amplifier 80 is supplied with signals from antenna or other signal supply leads 81, 82 and delivers amplified output signals by means of output leads 84, 85 to a frequency converter 90 where the radio frequency signals are shifted to a substantially fixed intermediate frequency (IF) channel for further amplification. One of the leads 85 is in the form of a common ground conductor. Radio frequency amplifier 80 and converter 90 are jointly tunable as by any desired arrangement indicated by dash lines 92. Converter output lead 93 carries the intermediate frequency signals to an intermediate frequency amplifier 100 having one or more amplification stages, one of which is indicated at 110. A conventional electron discharge or so-called vacuum tube 112 has a cathode 113, an anode 117, a control grid 114, as well as additional grids 115, 116, and effects the desired amplification. A coupling transformer 120 has a secondary winding 122 connected to supply intermediate frequency signals between control grid 114 and a common signal return conductor which may be the common ground 85. By-pass capacitor 124 establishes the signal return path and at the same time permits the maintenance of D.-C. amplifier bias voltages between the control grid 114 and the cathode 113, which is also returned to ground.

Amplified intermediate frequency signals are developed at the anode 117 and are passed through a conventional ratio detector circuit 130 where the frequency modulation waves are demodulated. A coupling transformer 131 has a tuned output circuit comprising a parallel connected capacitor 132 and inductor 133 loosely coupled inductively to primary windings 134 of a tuned primary circuit. A more tightly coupled inductor 135 and a series resistance 136 connect a center tap of the inductor 133 to one terminal of an intermediate frequency by-pass capacitor 137, the other terminal of which is grounded. A pair of oppositely polarized rectifiers 138, 141 connect the ends of inductor 133 to the outer terminals of a series connected pair of capacitors 143 and 144. The junction between these capacitors is connected to the ungrounded lead of capacitor 137 to complete the intermediate frequency circuit through the rectifiers. The D.-C. circuit for rectified current is completed by resistors 146, 147 and 148 connected to form a series bridge across the rectified ends of capacitors 143, 144. A relatively large stabilizing capacitor 149 is connected across resistor 147.

With suitable adjustment of the circuit constants, the supply of frequency modulated signals to transformer primary 134 will cause demodulated signals to appear across capacitor 137 from which they may be carried by conductor 150 to further amplifiers. For a more complete description of the ratio detector circuits, reference is made to the Seeley and Avins article in RCA Review, volume 8, pages 201 to 236 (1947). At the same time as demodulated signals appear at lead 150, a D.-C. voltage corresponding approximately to the amplitude of the supplied carrier, will appear across the ends 151, 152, of resistor 147, the end 151 connected to rectifier 141 becoming negative with respect to the other end.

For obtaining the desired dip response voltage a dip response circuit, generally similar to that of Fig. 2, is shown as connected to receive the input signals of amplifier 110. A lead 160 and a blocking capacitor 162 connect the amplifier grid 114 or plate 117 to one input connection 21 of filter circuit 62. The other filter input connection 68 is connected to the grounded signal return by means of capacitor 164. A rectifier 60 and rectifier load 61 are connected in the filter output circuit as in the construction of Figure 2, except that the rectifier polarity is inverted. The D.-C. rectifier circuit is completed by an intermediate frequency choke inductor 166 connected between leads 21 and 68. This inductor passes direct current but effectively prevents the passage of intermediate frequency signals.

The cathode end 66 of load 61 is grounded by lead 168, and the anode end 67 is connected by lead 170 to a center tap of resistor 147 to form a combining circuit for adding half of the carrier level response voltage across this resistor to the dip response voltage across load 61. An automatic gain control lead 172 impresses the combined voltage at the negative end 151 of resistor 147 upon the desired amplifiers to automatically vary their gain-controlling bias. For amplifier 110, a conductor 174 connects the by-passed end of input winding 122 to the automatic gain control lead 172. The automatic gain control bias accordingly appears between the control grid 114 and the grounded cathode 113, to suitably adjust the amplifier gain as is well known. Other leads 175, 176 may be similarly connected for automatically controlling the gain of radio frequency amplifier 80 as well as that of converter 90, where this uses an amplifying type of converter stage. Actuation of an auxiliary tuning indicator is here shown as effected by the dip response voltage appearing between lead 170 and ground.

If desired, other signal supply arrangements for the automatic gain control system may be used. Where different circuit portions of a signal receiving system are connected as sources of dip response and carrier level response respectively, the circuit portions should not have an unduly large difference in signal level. Adjacent stages of a cascaded chain of amplification stages are suitable. The primary and secondary windings of a coupling transformer also make a suitable pair of such sources.

Figure 4 shows a modified dip response circuit of the invention. Here a source 10 supplies signals through a filter circuit 262 which provides a D.-C. completing path. The filter circuit 262 is similar to that of Figure 3 except that the resonant circuit is provided by two inductances 271, 272 and one capacitor 270. The resistance 74 connecting by-passed signal return conductor 68 to the junction of the two inductances establishes the desired D.-C. path between the output leads 68, 223 of the filter. No separate signal-impeding choke return path is required.

Other forms of filter circuits may also be used. The resistance 74 may be omitted where the added sharpness of resistance cancellation is not needed. The resonant circuit portions may be provided by mechanically resonant structure such as of the piezoelectric type. Suitable filter action is also provided by a series resonant circuit connected between the signal supply leads and tuned to the proper frequency. Where the filter elements are inserted as a series impedance in the signal supply, it may be connected in series with either or both of the signal supply leads.

While several exemplifications of the invention have been indicated and described above, it will be apparent to those skilled in the art that other modifications may be made without departing from the scope of the invention as set forth in the appended claims.

What is claimed is:

1. In a selective high frequency signal receiving apparatus including a signal passing circuit with signal output means and at least one amplifier having a gain control element, and tunable to desired signals having a predetermined center frequency, an automatic gain control system comprising: a first frequency responsive means including a parallel resonant circuit coupled to said signal circuit including a rectifier and a load impedance connected across said parallel resonant circuit for developing a first direct voltage in said first load impedance, a second frequency responsive means including a second parallel resonant circuit serially connected with a second rectifier and load impedance connected across said first parallel resonant circuit for developing a second direct voltage in said second load impedance, and means for connecting said load impedances in series aiding relation to said control elements to thereby apply the sum of said voltages to the gain control element of said amplifier.

2. The combination as defined by claim 1 including auxiliary tuning indicator means connected to one of said frequency responsive means for sharply indicating proper tuning of the apparatus.

3. In a selective signal receiving and translating channel having at least one amplifying stage including in its output a signal selective network, an automatic gain control system comprising, a first parallel resonant circuit coupled to said signal selective network, a first rectifier and a first rectifier load impedance being connected in series arrangement in shunt with said parallel resonant circuit, for developing across said load a first direct-current potential having a characteristic substantially identical to the selectivity characteristic of said first parallel resonant circuit, a second parallel resonant circuit, a second rectifier and a second rectifier load impedance, said second resonant circuit, said second rectifier and said second rectifier load impedance being connected in series arrangement in shunt with said first parallel resonant circuit for developing a second direct-current potential corresponding in magnitude to the transmission characteristic of said second parallel resonant circuit, circuit means connecting the junction of said second rectifier and said second rectifier load impedance to gain control responsive elements in said channel and the junction of the first load impedance and the first rectifier being connected to a point of fixed reference potential.

JACK AVINS.

References Cited in the file of this patent

UNITED STATES PATENTS

| Number | Name | Date |
|---|---|---|
| 2,050,679 | Wheeler | Aug. 11, 1936 |
| 2,096,874 | Beers | Oct. 26, 1937 |
| 2,216,451 | Muller | Oct. 1, 1940 |
| 2,228,084 | Murcek | Jan. 7, 1941 |
| 2,237,457 | Tellegen | Apr. 8, 1941 |
| 2,264,019 | Case | Nov. 25, 1941 |
| 2,472,301 | Koch | June 7, 1949 |
| 2,497,841 | Seeley | Feb. 14, 1950 |